(12) United States Patent  
Merienne et al.

(10) Patent No.: US 9,599,650 B2  
(45) Date of Patent: Mar. 21, 2017

(54) SECURE ON-BOARD SYSTEM FOR CHARGING THE BATTERY OF A MOTOR VEHICLE FROM A POWER SUPPLY NETWORK

(71) Applicant: RENAULT s.a.s., Boulogne-Billancourt (FR)

(72) Inventors: Ludovic Merienne, Villejust (FR); Ahmed Ketfi-Cherif, Elancourt (FR); Christophe Ripoll, Chevreuse (FR); Christophe Konate, Massy (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 169 days.

(21) Appl. No.: 14/373,944

(22) PCT Filed: Jan. 18, 2013

(86) PCT No.: PCT/FR2013/050116  
§ 371 (c)(1),  
(2) Date: Jul. 23, 2014

(87) PCT Pub. No.: WO2013/117836  
PCT Pub. Date: Aug. 15, 2013

(65) Prior Publication Data  
US 2015/0028818 A1    Jan. 29, 2015

(30) Foreign Application Priority Data  
Feb. 8, 2012  (FR) ...................................... 12 51168

(51) Int. Cl.  
*H02J 7/00* (2006.01)  
*H02J 7/14* (2006.01)  
(Continued)

(52) U.S. Cl.  
CPC .............. *G01R 31/025* (2013.01); *B60L 3/00* (2013.01); *B60L 11/1816* (2013.01);  
(Continued)

(58) Field of Classification Search  
CPC   B60L 11/182; B60L 11/1838; B60L 11/1818;  
B60L 11/1846; B60L 11/1862  
(Continued)

(56) References Cited

U.S. PATENT DOCUMENTS 4,224,652 A      9/1980  Fiorentzis  
4,700,300 A  *  10/1987  Schultz .................. G01V 5/101  
                                                                  250/256  
(Continued)

FOREIGN PATENT DOCUMENTS

DE    43 29 382 A1    3/1995  
EP    0 518 785 A1    12/1992  
(Continued)

OTHER PUBLICATIONS

International Search Report issued Apr. 12, 2013 in PCT/FR2013/050116.  
(Continued)

*Primary Examiner* — M'Baye Diao  
(74) *Attorney, Agent, or Firm* — Oblon, McClelland, Maier & Neustadt, L.L.P.

(57) ABSTRACT

A secure system for charging a battery of a motor vehicle from a power supply network, which system is in a vehicle and includes a mechanism measuring frequency of the network, an injection mechanism injecting current pulses into the network, a mechanism measuring voltage between the ground and a neutral of the network, an analog filter filtering the measured voltages at high frequencies, a digital filter filtering the analog-filtered voltages at low frequencies, and a mechanism determining resistance between the ground (Continued)

and the neutral of the network on the basis of the digitally filtered voltages and an amplitude of the current pulses. The digital filter includes a mean value filter which determines a mean value based on N voltage measurements spaced apart by a time interval T+T/N, where T is the period of the network determined by the mechanism measuring the frequency of the network.

11 Claims, 3 Drawing Sheets

(51) Int. Cl.
*B60L 1/00* (2006.01)
*G01R 31/02* (2006.01)
*G01R 27/20* (2006.01)
*B60L 11/18* (2006.01)
*B60L 3/00* (2006.01)
*G01R 31/00* (2006.01)
*H02J 7/02* (2016.01)

(52) U.S. Cl.
CPC ........ *B60L 11/1848* (2013.01); *G01R 27/205* (2013.01); *H02J 7/0029* (2013.01); *H02J 7/0052* (2013.01); *G01R 31/007* (2013.01); *H02J 7/02* (2013.01); *Y02T 10/7005* (2013.01); *Y02T 10/7072* (2013.01); *Y02T 90/121* (2013.01); *Y02T 90/128* (2013.01); *Y02T 90/14* (2013.01); *Y02T 90/163* (2013.01); *Y02T 90/169* (2013.01); *Y04S 30/14* (2013.01)

(58) Field of Classification Search
USPC .................................. 320/104, 137; 307/9.1
See application file for complete search history.

(56) References Cited

U.S. PATENT DOCUMENTS

| | | | |
|---|---|---|---|
| 5,272,440 A | 12/1993 | Weynachter et al. | |
| 5,508,620 A | 4/1996 | Pfiffner | |
| 8,143,903 B2* | 3/2012 | Pommerenke | G01R 29/0878 324/633 |
| 8,611,485 B2* | 12/2013 | Hann | H03L 7/08 375/260 |
| 8,750,408 B2* | 6/2014 | Schleicher | H04B 1/71635 375/295 |
| 2009/0160454 A1 | 6/2009 | Johansson et al. | |
| 2010/0060296 A1* | 3/2010 | Jiang | G01D 18/00 324/613 |
| 2011/0085272 A1 | 4/2011 | Schweitzer, III et al. | |

FOREIGN PATENT DOCUMENTS

| | | |
|---|---|---|
| EP | 1 482 317 A1 | 12/2004 |
| EP | 1 890 369 A1 | 2/2008 |
| FR | 2 382 786 A1 | 9/1978 |
| WO | WO 99/19963 A1 | 4/1999 |
| WO | WO 2010/069739 A1 | 6/2010 |

OTHER PUBLICATIONS

Rasheek Rifaat, "Considerations and Improvements of Configuration and Protection of a 72 kV Mining Resistance Neutral Grounded System" Industrial and Commercial Power Systems Technical Conference, XP031311968, May 2008, pp. 1-5.
U.S. Appl. No. 14/401,436, filed Nov. 14, 2014, Merienne.

* cited by examiner

SECURE ON-BOARD SYSTEM FOR CHARGING THE BATTERY OF A MOTOR VEHICLE FROM A POWER SUPPLY NETWORK

The invention relates to the security of a user of an on-board device for charging a battery of a motor vehicle, and more particularly the estimation of the quality of the earth of the power supply network coupled to the device for charging the battery of the motor vehicle.

During the charging of a battery of an electric motor vehicle, intense currents travel through the power supply network toward the battery of the vehicle. To be able to correctly charge the vehicle, these currents are chopped in such a way as to comply with the constraints of the power supply network.

The chopping of the electric currents leads to the appearance of leakage currents that must be evacuated through the earth connection of the power supply network. This earth connection is linked to the chassis of the vehicle and therefore offers a path to all the unwanted currents.

To ensure completely safe charging, it is necessary to ensure that the earth connection is of good quality, i.e. that the equivalent resistance of the earth path is low compared to the resistance that a human being touching the chassis of the motor vehicle would offer. Without this earth connection, a touch current phenomenon can appear. If a man happened to touch the chassis of the vehicle, it is his body that would establish the connection between the charger and the earth, and it is therefore through him that all the potentially dangerous leakage currents would pass, without any added control device.

A poor quality earth, i.e. of resistance equivalent to that of a human being, also allows the passage of part of the leakage currents through the body of the individual. Indeed, if an individual happened to touch the chassis of the charging vehicle, in this case, the leakage currents would have two parallel paths of same resistance, therefore half the leakage currents could pass through the individual to return to the earth.

To ensure that no touch current can appear, it is necessary to ensure that the value of the resistance of the earth connection is below a certain threshold before charging the battery of the motor vehicle.

To be able to estimate the resistance between the earth and the neutral of the power supply network, it is possible to inject current pulses directly into the earth path and looping back via the network neutral and to measure the voltage between the neutral and the earth.

In the ideal case, the current injected into the earth is measured as well as the voltage, which is the image of the injected current according to Ohm's law. The value of the resistance is then obtained by dividing the measured voltage by the measured current.

Unfortunately, it is impossible to obtain correct results this easily because the voltage between the neutral and the earth is very perturbed. Indeed, as has already been mentioned above, any electrical appliance generates a certain amount of leakage current. As these currents also pass through the earth, they perturb the measurement of the voltage between the neutral and the earth.

For example, in the case of a residence where the parking spaces are equipped with charging points, it would be necessary to estimate the resistance in an environment extremely perturbed by all the battery chargers operating in neighboring parking spaces. To these perturbation currents can be added defects linked to the power supply network that provoke a variation over time in the voltage between the neutral and the earth.

Certain data are known for all of these perturbations. At low frequencies, notably for frequencies below 1 kHz, these perturbations are generated at the harmonics of the power supply network, i.e. for example 50 Hz, 100 Hz, etc., and have a maximum amplitude of 7 V for the effective voltage and 6.6 mA for the currents. These levels of perturbation are defined by the EDF standards. For higher frequencies, the EDF standards predict amplitudes of perturbation currents varying continuously between 6.6 mA at 1.5 kHz and 66 mA at 15 kHz, the amplitude of the current remaining at 66 mA up to 150 kHz.

Finally, a final constraint arises from the fact that one cannot send just any current into the earth. It is especially important not to trip the network to which the circuit is connected. It is therefore impossible to send pulses of too high an amplitude and/or of too long a duration.

The challenge is therefore to succeed in estimating the earth resistance despite all the sources of error, while observing the constraints imposed by the obligation of having to embed the system on board a motor vehicle, the processors of which operate at a maximum frequency of 10 kHz.

Appliances exist on the market that carry out an estimation of the earth resistance. These appliances have a computational power well above that available on a motor vehicle and are too highly priced to envision putting one on each motor vehicle.

However, these appliances are not configured for the purpose of managing the security of an individual. Indeed, they are only configured to give information on the value of the earth resistance.

Patent application CN 201 508 392 describes a method for measuring the earth resistance making it possible to eliminate a single frequency in the neutral-earth voltage. However, the perturbations generated by the other harmonics are not eliminated and further perturb the measurement of the earth-neutral voltage and consequently the determination of the earth resistance.

Patent application EP 1 482 317 describes a method for injecting a current of very high amplitude in such a way as to improve the signal-to-noise ratio of the measurement of the earth-neutral voltage. However, the method requires a suitable environment able to withstand the high current peaks in the earth and is thus only applicable in factories where the trip devices tolerate leaks ten to a thousand times higher than the trip devices of a domestic network, which generally trip for a current above 33 mA.

Patent application EP 642 027 describes a method relying on an injection of voltage between the earth and the neutral. However, the implementation of such a method requires a system of much too large a size to be incorporated into the vehicle, and to be able to impose a voltage on the network.

The invention proposes to palliate these drawbacks using an on-board system on a motor vehicle using a method for estimating the resistance of the on-board earth making it possible to filter the perturbations due to the power supply network.

According to one aspect of the invention, there is proposed according to one embodiment a secure system for charging the battery of a motor vehicle from a power supply network. The system is on board the motor vehicle and comprises means for measuring the frequency of the power supply network, means for injecting current pulses into the power supply network, means for measuring the voltage between the earth and the neutral of the power supply network, an analog filter for filtering the measured voltages at high frequencies, a digital filter for filtering the analog-filtered voltages at low frequencies, and means for determining the resistance between the earth and the neutral of the power supply network on the basis of the digitally filtered voltages and the amplitude of the current pulses.

According to a general feature of the invention, the digital filter comprises a mean value filter determining a mean value on the basis of N voltage measurements spaced apart by a time interval T+T/N, with T the period of the power supply network determined by the means for measuring the frequency of the power supply network.

Thus, for a conventional power supply network at 50 Hz and a mean value taken over 40 measurements, the mean value filter will determine a mean value on the basis of 40 voltage measurements performed with an interval between of 20.5 ms between two measurements.

The high frequencies comprise frequencies above 2 kHz and particularly those above 5 kHz. The low frequencies comprise frequencies below 5 kHz and particularly frequencies lying between 50 Hz and 2 kHz.

In the case of a power supply network with a frequency of 60 Hz and of a mean value taken on the basis of 40 voltage measurements, the measurements will be spaced apart by a time interval of 17.1 ms rounding to the nearest 0.1 ms (T=16.7 ms).

Preferably, the analog filter is a second-order analog filter with a cut-off frequency lying between 800 Hz and 1.2 kHz, and preferably of 1 kHz, and a damping factor lying between 0.6 and 0.8, and preferably of 0.7, in such a way as to obtain damping of −20 dB at a frequency of 3 kHz.

The choice of an analog filter with such features makes it possible to reduce as much as possible the duration of the current pulses injected into the power supply network to take the measurements. The reduction in the duration of the current pulses makes it possible to increase the amplitude of the current pulses and thus to improve the signal-to-noise ratio.

Advantageously, given the passband of the analog filter, for the measured voltage to be the true image of the current of the injected pulses, i.e. to take account of the response time of the analog filter, the current pulses have a duration at least above 0.8 ms, and preferably of 1 ms, and a maximum amplitude lying between 18 mA and 22 mA, and preferably of 20 mA.

The secure on-board system can advantageously comprise secure command means capable of activating the charging of the battery from the power supply network only if the measured earth resistance is below an activation threshold.

Thus, if the earth of the power supply network has a resistance above the activation threshold, i.e. a resistance considered as at least equivalent to the resistance of a human body, the power supply network is not coupled to the battery of the vehicle and the charging is not begun. This is done in order to avoid the risk of a touch current appearing.

To do this, the activation threshold can advantageously correspond to a resistance value lying between 20 and 600 ohms, and preferably of 200 ohms.

According to another aspect, there is proposed in one embodiment a secure method for charging the battery of a motor vehicle from a power supply network estimating the resistance between the earth and the neutral of the power supply network, wherein the frequency of the power supply network is measured, current pulses are injected into the power supply network, measurements of the voltage between the earth and the neutral of the power supply network are performed in response to each pulse, the measured voltages are analog-filtered at high frequencies, the analog-filtered voltages are filtered digitally at low frequencies, and the resistance between the earth and the neutral is determined on the basis of the digitally filtered voltages and the amplitude of the current pulses. According to a general feature, the digital filtering comprises the determining of a mean value on the basis of N voltage measurements spaced apart by a time interval T+T/N, with T the period of the power supply network determined on the basis of the measurement of the frequency of the power supply network.

Preferably, the analog filtering comprises a second-order filtering with a cut-off frequency lying between 800 Hz and 1.2 kHz, and preferably of 1 kHz, and a damping factor lying between 0.6 and 0.8, and preferably of 0.7.

Preferably, the current pulses have a duration at least above 0.8 ms, and preferably of 1 ms, and a maximum amplitude lying between 18 mA and 22 mA, and preferably of 20 mA.

Preferably, the duration of the current pulses injected into the power supply network corresponds at least to the period of the power supply network.

Advantageously, it is possible to perform N=40 measurements of the voltage between the earth and the neutral to eliminate the 39 first harmonics of the power supply network.

Preferably, the power supply network is coupled to the battery only if the measured earth resistance is below an activation threshold.

Other advantages and features of the invention will become apparent upon examining the detailed description of an embodiment and a mode of implementation, in no way limiting, and the appended drawings, wherein:

FIG. 1 schematically shows a secure on-board system for charging a battery of a motor vehicle according to an embodiment;

Figure 1:
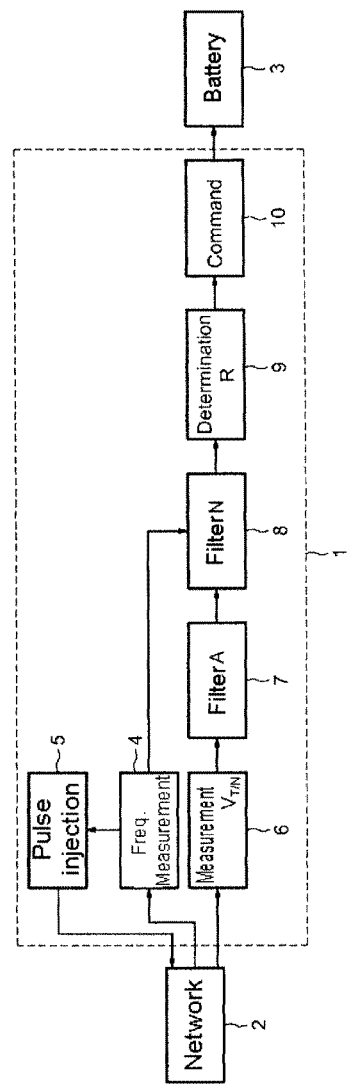

FIG. 1 represents a secure system 1 according to one embodiment of the invention. The secure system 1 is on board a motor vehicle and is intended to be coupled between a power supply network 2 and a battery 3 of the motor vehicle when charging the battery.

The system 1 comprises means 4 for measuring the frequency of the power supply network 2 as well as means 5 for injecting current pulses into the power supply network 2. The means 4 for measuring the frequency are coupled to the means 5 for injecting current pulses in such a way as to deliver to the means 5 for injecting current pulses the value of the frequency of the power supply network 2. The means 5 for injecting current pulses adjust the minimum duration of the pulses to the period T of the signal from the power supply network 2. In the case of a power supply network 2 at 50 Hz the minimum duration of the current pulses will be 1 ms. The system 1 also comprises means 6 for measuring the voltage between the earth and the neutral of the power supply network 2 which perform a measurement of voltage in response to each current pulse injected into the earth and looping back via the neutral of the power supply network 2.

The processors of a motor vehicle operate at a maximum frequency of 10 kHz. It is already known from Shannon's theorem that it will be totally impossible to filter perturbations due to frequencies above 5 kHz using a digital filter. To be able to get rid of the high frequency perturbations in the voltage measurements, the system 1 comprises an analog filter 7 coupled at the output of the voltage measuring means 6.

The analog filter 7 used in this embodiment is a second-order analog filter with a cut-off frequency at 1 kHz and a damping factor of 0.7 in order to obtain damping of −20 db at 3 kHz. It is preferable to use a filter with such features rather than any other analog filter, because it makes it possible to reduce as much as possible the duration of the current pulses injected and thus allows an increase in the amplitude of the injected current pulses.

The system 1 comprises a digital filter 8 coupled to the output of the analog filter 7. The digital filter 8 makes it possible to eliminate the perturbations due to the harmonics of the power supply network 2 between 50 Hz and 2 kHz. Above 2 kHz, the analog filter already attenuates the perturbations sufficiently.

Given the passband of the analog filter, for the measured voltage to be the true image of the current of the injected pulses, it is preferable for the minimum duration of the current pulses injected to correspond at least to the response time of the analog filter for the filtering at high frequency to be efficient. For this purpose, the duration of the injected pulses must at least correspond to a period of the signal of the power supply network 2. Thus, for a power supply network 3 of frequency 50 Hz, the minimum duration of the injected current pulses must be 1 ms.

A longer duration of current pulse would make it necessary to reduce the amplitude of the current pulses to avoiding making the system trip. However, it is important to emit pulses of the highest possible amplitude because they generate voltages that are higher, and therefore more visible in the noise, in response.

In the case of a power supply network 2 at 50 Hz, for a pulse of 1 ms, the amplitude of the current pulses can reach 20 mA at the most without there being any risk of the system tripping. A pulse of 20 mA through a resistance of 50 ohms will generate a voltage of 1 V embedded in noise of 50 V (sum of the noise at the harmonics of the power supply network). Digitally, it is therefore necessary to eliminate as much as possible the harmonics of the power supply network 2.

To do this, the digital filter 8 comprises a mean value filter which has the advantage of infinitely attenuating the targeted frequencies. For example, storing two points separated by 10 ms and taking the mean value thereof makes it possible to totally eliminate the 50 Hz.

The digital filter is coupled to the means 4 for measuring the frequency of the power supply network 2 in order to receive the information relating to the electrical period T of the power supply network 2.

By recording forty voltage measurement points equally distributed over the 20 ms of electrical period, it is possible to eliminate up to the 39$^{th}$ harmonic of the network, i.e. up to the frequency 1950 Hz on a power supply network 2 operating at 50 Hz.

However, making pulses of 1 ms spaced apart by 500 μs each is impossible to do with a pulse amplitude of 20 mA. To be able to calculate this mean value regardless, the system performs measurements by shifting at each new measurement by an electrical period T from the signal of the power supply network 2 in addition to the measurement shift d equal to d=T/N with N the number of measurements to be performed in an electrical signal period T.

Thus, in the case of a power supply network at 50 Hz and of a mean value made on the basis of 40 measurements, the first measurement would be made at t=0, and the second at t=20.5 ms, the interval corresponding to the addition of an electrical period T=1/50=20 ms with a measurement shift d=20/40=0.5 ms. This second measurement would be identical to a measurement carried out only 500 μs after the first since the noise signal is periodic with a period T=20 ms.

By thus making forty acquisitions of voltage measurement at the ends of pulses spaced apart by 20.5 ms and by taking the mean value of the measured voltages over these forty measurements, the digital filter 8 eliminates the perturbations at the harmonics of the network and makes it possible to retrieve the continuous component due to the current pulses injected into the power supply network 2.

The mean voltage thus digitally filtered is delivered to means 9 for determining the resistance between the earth and the neutral of the power supply network 2. The value of the earth resistance is determined by dividing said mean voltage by the amplitude of the current pulses injected into the power supply network 2.

The system 1 comprises secure command means 10 coupled at the input to the determining means 9 and at the output to the battery 3 of the motor vehicle. If the value of the earth resistance determined is below a threshold value of 500 ohms, the coupling is performed with the battery 3 of the motor vehicle, and the charging can start. Otherwise, the battery 3 is not electrically coupled to the power supply network 2 and the charging does not take place.

Figure 2:
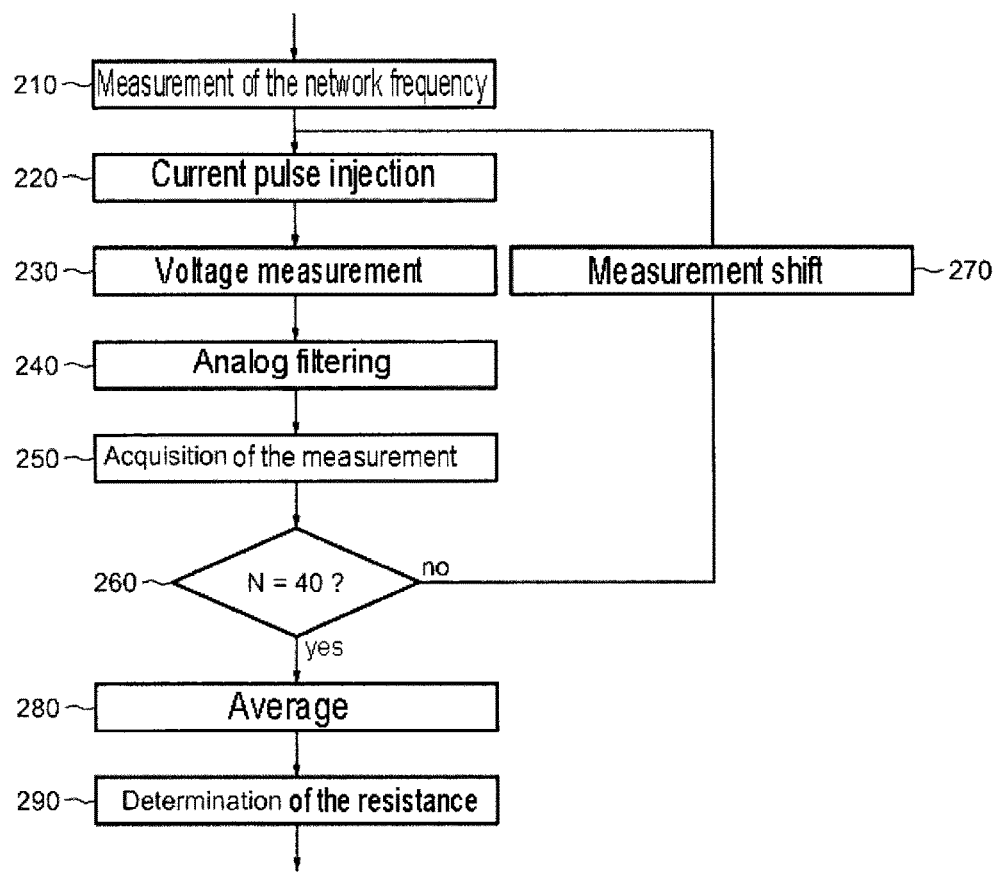
FIG. 2 shows a flow chart of a method for estimating the earth resistance of a power supply network according to a mode of implementation.

FIG. 2 shows a flowchart of a method for estimating the resistance between the earth and the neutral of a power supply network used to charge a battery of a motor vehicle according to one mode of implementation.

In a first step 210, the frequency of the power supply network 2 coupled to the motor vehicle to recharge the battery 3 of the motor vehicle is measured.

In a following step 220, current pulses are injected into the power supply network 2. The duration of the pulses depends on the chosen analog filter 7 which itself depends on the period of the power supply network 2.

Then, in a step 230, voltage measurements are carried out between the earth and the neutral of the power supply network 2 at the end of each of the injected current pulses.

In a following step 240, each measured voltage is analog-filtered at high frequencies.

The measurement is next acquired, in a step 250, then the number of measurements carried out in a step 260 is tested. If 40 voltage measurements have not yet been carried out, a measurement is started again from a new current pulse injection at step 220 on a following electrical period T, and having shifted in a step 270 the moment of measurement of a shift time d=T/N, i.e. in the case of a power supply network 2 at 50 Hz a time d=0.5 ms.

Once the 40$^{th}$ measurement has been carried out, digital filtering is carried out at low frequencies in a following step 280 while taking the mean value of the forty measured voltages, and finally, in a step 290, the resistance between the earth and the neutral is determined by dividing the mean voltage by the amplitude of the current pulses.

Figure 3:
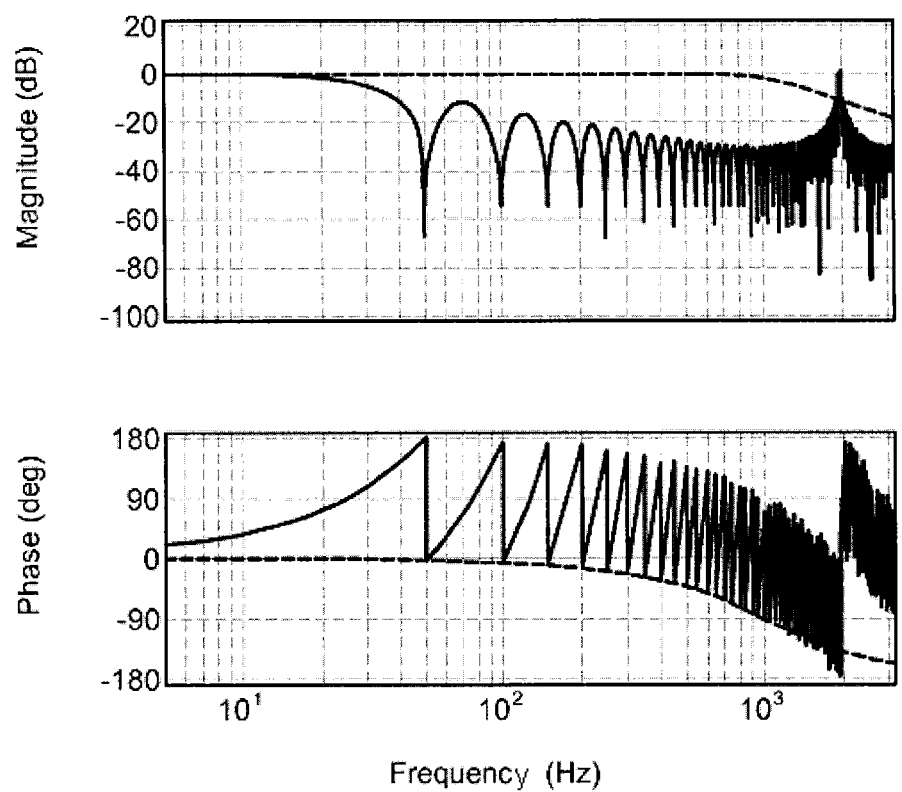
FIG. 3 represents two Bode diagrams, of amplitude and phase, illustrating the actions of the two filters of the system in FIG. 1.

FIG. 3 shows on two Bode diagrams the amplitude and the phase of the actions of the analog filter in a dashed line and of the digital filter in a solid line for a frequency of the power supply network 2 of 50 Hz.

The secure system 1 is adapted to the constraints of the motor vehicle and makes it possible to verify the quality of the earth of a home network before beginning the charging of the battery of the motor vehicle on board which the secure system is embedded.

The invention claimed is:

1. A secure system for charging a battery of a motor vehicle from a power supply network, the system being on board the motor vehicle and comprising:
   means for measuring frequency of the power supply network;
   means for injecting current pulses into the power supply network;
   means for measuring voltage between ground and a neutral of the power supply network;
   an analog filter for filtering the measured voltages at high frequencies;
   a digital filter for filtering the analog-filtered voltages at low frequencies; and
   means for determining resistance between the ground and the neutral of the power supply network on the basis of the digitally filtered voltages and an amplitude of the current pulses;
   wherein the digital filter comprises a mean value filter determining a mean value on the basis of N voltage measurements spaced apart by a time interval T+T/N, with N being a number of voltage measurements and T being the period of the power supply network determined by the means for measuring the frequency of the power supply network.

2. The system as claimed in claim 1, wherein the analog filter is a second-order analog filter with a cut-off frequency lying between 800 Hz and 1.2 kHz, or of 1 kHz, and a damping factor lying between 0.6 and 0.8, or of 0.7.

3. The system as claimed in claim 2, wherein the current pulses have a duration at least above 0.8 ms, or of lies, and a maximum amplitude lying between 18 mA and 22 mA, or of 20 mA.

4. The system as claimed in claim 1, further comprising secure command means capable of activating charging of the battery from the power supply network only if the measured ground resistance is below an activation threshold.

5. The system as claimed in claim 4, wherein the activation threshold corresponds to a resistance value lying between 20 and 600 ohms, or of 200 ohms.

6. A secure method for charging a battery of a motor vehicle from a power supply network estimating resistance between the ground and a neutral of the power supply network, comprising:
   measuring, with first circuitry, frequency of the power supply network;
   injecting, with second circuitry, current pulses into the power supply network;
   performing, with third circuitry, measurements of the voltage between the ground and the neutral of the power supply network in response to each pulse;
   analog-filtering, with an analog filter, the measured voltages at high frequencies;
   filtering digitally, with a digital filter, the analog-filtered voltages at low frequencies; and
   determining, with fourth circuitry, resistance between the ground and the neutral on the basis of the digitally filtered voltages and an amplitude of the current pulses,
   wherein the digital filtering comprises determining a mean value on the basis of N voltage measurements spaced apart by a time interval T+T/N, with N being a number of voltage measurements and T being the period of the power supply network determined on the basis of the measurement of the frequency of the power supply network.

7. The method as claimed in claim 6, wherein the analog filtering comprises a second-order filtering with a cut-off frequency lying between 800 Hz and 1.2 kHz, or of 1 kHz, and a damping factor lying between 0.6 and 0.8, or of 0.7.

8. The method as claimed in claim 7, wherein the current pulses have a duration at least above 0.8 ms, or of 1 ms, and a maximum amplitude lying between 18 mA and 22 mA, or of 20 mA.

9. The method as claimed in claim 6, wherein a duration of the current pulses injected into the power supply network corresponds at least to the period of the power supply network.

10. The method as claimed in claim 6, wherein the power supply network is coupled to the battery only if the measured ground resistance is below an activation threshold.

11. A secure system for charging a battery of a motor vehicle from a power supply network, the system being on board the motor vehicle and comprising:
    first circuitry configured to measure frequency of the power supply network;
    second circuitry configured to inject current pulses into the power supply network;
    third circuitry configured to measure voltage between ground and a neutral of the power supply network;
    an analog filter configured to filter the measured voltages at high frequencies;
    a digital filter configured to filter the analog-filtered voltages at low frequencies; and
    fourth circuitry configured to determine resistance between the ground and the neutral of the power supply network on the basis of the digitally filtered voltages and an amplitude of the current pulses;
    wherein the digital filter comprises a mean value filter determining a mean value on the basis of N voltage measurements spaced apart by a time interval T+T/N, with N being a number of voltage measurements and T being the period of the power supply network determined by the first circuitry configured to measure the frequency of the power supply network.

* * * * *